United States Patent [19]

Akylas et al.

[11] Patent Number: 5,056,061
[45] Date of Patent: Oct. 8, 1991

[54] CIRCUIT FOR ENCODING IDENTIFICATION INFORMATION ON CIRCUIT DICE USING FET CAPACITORS

[75] Inventors: Victor R. Akylas, San Jose, Calif.; Cornelis J. H. De Zeeuw, Eindhoven

[73] Assignee: N. A. Philips Corporation, New York, N.Y.

[21] Appl. No.: 453,546

[22] Filed: Dec. 20, 1989

[51] Int. Cl.$^5$ .............................................. G11C 17/00
[52] U.S. Cl. ..................................... 365/96; 365/102; 365/104; 365/182; 365/189.02; 365/225.7
[58] Field of Search ................. 365/96, 102, 104, 103, 365/225.7, 189.02, 182

[56]  References Cited

U.S. PATENT DOCUMENTS

| | | | |
|---|---|---|---|
| 2,784,389 | 3/1957 | Keuy | 365/96 |
| 4,399,372 | 8/1983 | Tanimoto et al. | 365/96 |
| 4,402,067 | 8/1983 | Moss et al. | 365/189.02 |
| 4,507,756 | 3/1985 | McElroy | 365/96 |
| 4,507,757 | 3/1985 | McElroy | 365/96 |
| 4,532,607 | 7/1985 | Uchida | 365/96 |
| 4,592,020 | 5/1986 | Takemae et al. | 365/182 |
| 4,686,384 | 8/1987 | Harvey et al. | 365/96 |

FOREIGN PATENT DOCUMENTS

| | | |
|---|---|---|
| 0057645 | 8/1982 | European Pat. Off. . |
| 0133955 | 3/1985 | European Pat. Off. . |
| 60-257555 | 12/1985 | Japan . |

*Primary Examiner*—Joseph E. Clawson, Jr.
*Attorney, Agent, or Firm*—Leroy Eason

[57]  ABSTRACT

A programmable circuit for inclusion in an integrated circuit die for encoding information identifying or otherwise relating to such die, such circuit utilizing a plurality of single bit information storage and reading bit cells, each bit cell including a MOSFET or IGFET capacitor structure as a bit storage element. A gate of the MOSFET or IGFET acts as a positive voltage plate of the capacitor, while a source and drain are both connected to ground and act as ground plates of the capacitor. Normally, an open circuit is present between the gate and the source and drain, however, when a programming high voltage is applied to the gate, the capacitor structure physically breaks down and a conduction path is formed between the gate and the source or drain. The presence or absence of this conduction path enables the MOSFET or IGFET capacitor structure to act as a binary bit. Read circuitry selectively senses the presence or absence of the conduction path of each bit cell, and a multiplexer can be employed to connect the read circuitry to the successive bit cells sequentially. Protection circuitry is provided to prevent the read circuitry from being damaged by the applied programming voltage. The programmable circuit can be fabricated by the same integrated circuit fabrication techniques used to fabricate the remaining circuits on the die.

4 Claims, 1 Drawing Sheet

CIRCUIT FOR ENCODING IDENTIFICATION INFORMATION ON CIRCUIT DICE USING FET CAPACITORS

BACKGROUND OF THE INVENTION

The present invention relates in general to a circuit for encoding identification, serialization, or other information on circuit dice.

There is a need for providing identification and other types of information on circuit dice or chips. For example, it may be desireable or necessary in circuit parameter studies to monitor small shifts in the values of the various circuit parameters of a test die over time. In order to observe such shifts accurately, a particular test circuit die must be used for each measurement because the variation of the circuit parameters from die to die may be comparable to, or even larger than, the shifts that are to be monitored. Consequently, some means must be provided by which a particular circuit die can be identified. The use of visible or optically readable marks and codes is not generally suitable because the dice are encapsulated so that the marks or codes can not be seen. As a result, electrical identification of the dice is the only workable solution, especially for large volumes of parts processed in production, assembly and test facilities. The only other alternative would be to maintain part identification with physical means, such as part carriers or identification bins, however, this solution is unworkable with large numbers of parts and the risk of misclassification is unacceptably high.

In technologies in which there are inherently built-in programmable structures, such as programmable memories, it is a rather straight forward procedure to use these available structures for encoding the identification information into the circuits. However, with other types of circuits that do not include any programmable structures, extra undesirable or impossible fabrication steps are required to add them which could have an effect on the measured circuit parameters that would defeat the whole purpose of the parameter study. For example, the identification circuitry may require extra layers of material or the use of non-standard masks which may be incompatible with current wafer stepper lithographic techniques, and thus could not be utilized therewith.

SUMMARY OF THE INVENTION

It is therefore the object of the present invention to provide in an intergrated circuit die a circuit for electrically encoding identification and other information relating to such die and which can be easily incorporated into the die using fabrication steps that are compatible with present integrated circuit fabrication techniques.

It is another object of the invention to provide in an intergrated circuit die a programmable information storage and reading circuit which includes plurality of bit cells each of which employs a capacitor structure as a single binary information bit store and which can be physically altered to change its binary value selectively.

These and other objects of the invention are achieved through use of a programmable identification circuit that can be formed on a circuit die either after or during fabrication of the die and employs circuit technology which is compatible with the remaining circuits on the circuit die. In the preferred embodiment of the invention, the information is encoded as a plurality of binary bits, and each bit of information is represented by a capacitor structure embodied in a semiconductor structure that is wired to act as a capacitor, such as a metal oxide semiconductor field effect transistor (MOSFET) or an insulated gate field effect transistor (IGFET). Normally, the capacitor is open circuited so that no current can flow through it. However, when a high voltage is applied across the capacitor from a programming voltage probe, the structure breaks down and creates a conduction path between the gate and the source or drain of the field effect transistor. The identification information can therefore be programmed into the circuit die in binary form through the selective application of high voltage to the MOSFET or IGFET capacitors. After the information has been programmed into the circuit die, it can be read in numerous ways, such as with a read circuit which tests the condition of each of the capacitors on a die sequentially. The use of a MOSFET or IGFET structure in this manner enables the identification bit cells to be formed on a circuit die by conventional MOS technology and fabrication techniques without the need for using other incompatible fabrication techniques.

BRIEF DESCRIPTION OF THE DRAWINGS

The foregoing and additional objects, features and advantages of the present invention will become apparent from a consideration of the following detailed description of a preferred embodiment thereof taken in conjunction with the accompanying drawings in which.

DETAILED DESCRIPTION OF THE PREFERRED EMBODIMENT

Figure 1:
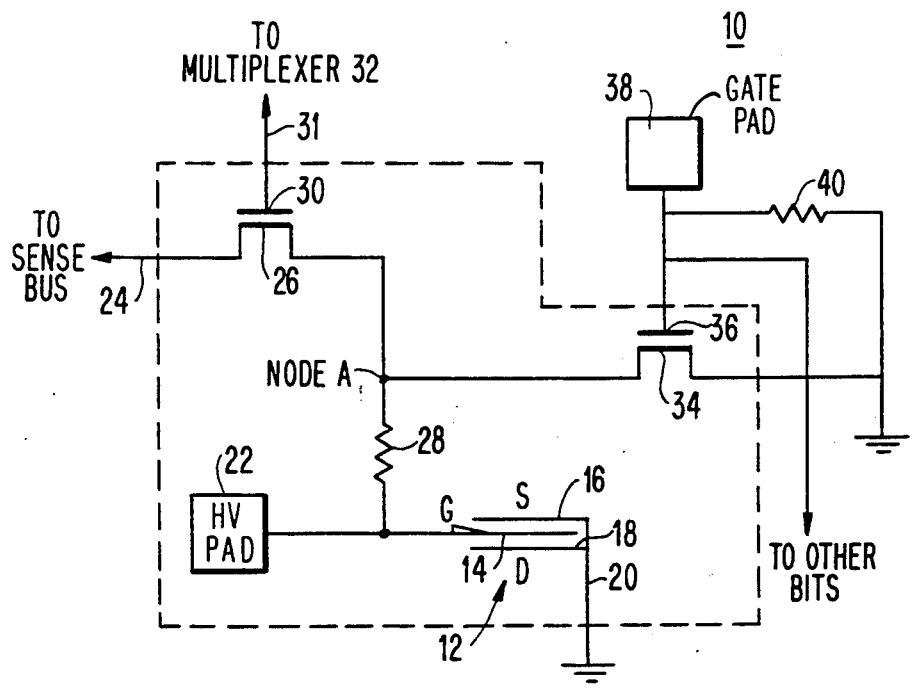
FIG. 1 is a schematic diagram of a bit cell for storing and reading a single bit of information in accordance with the preferred embodiment of the present invention; and, FIG. 2 is a schematic diagram of a programmable circuit for reading information from a plurality of bit cells constructed in accordance with FIG. 1.

Turning now to a more detailed consideration of the invention, a single bit information storage and reading bit cell 10 is illustrated in FIG. 1 which includes a programmable MOSFET or IGFET structure 12 for storing a single bit of binary information. The MOSFET or IGFET 12 includes a gate 14, a source 16 and a drain 18. The source 16 and the drain 18 are wired together and connected to ground via a path 20. Wired in this manner, the MOSFET or IGFET 12 acts as capacitor with the gate 14 acting as a positive voltage plate and the source 16 and drain 18 acting as ground plates. It should be noted that it is not necessary that a MOSFET or IGFET be used to form the capacitor, since this could be accomplished using any type of thin oxide capacitor structure as well.

Under normal circumstances, no direct current can flow between the gate 14 and the source 16 or the drain 18. However, if a sufficiently high voltage is momentarily placed on the gate 14, the physical structure of the capacitor 12 will breakdown and a conduction path will be formed between the gate 14 and the source 16 and/or the drain 18. In this manner, the capacitor 12 can be programmed by the selective application of a destructive high voltage thereto to represent either a binary 1 or a binary 0 depending on whether or not there is continuity between the gate 14 and the source 16 or drain 18. The use of the MOSFET or IGFET capacitor 12 in this manner enables the bit cell 10 to be formed on a circuit die with the same MOS fabrication techniques, such as wafer stepper lithography, that are employed to make the rest of the circuits on the circuit die. Thus formation of the bit cell 10 will not interfere with other circuit parameters of the circuit die.

A programming voltage pad 22 is connected via a path 24 to the gate 14 for the purpose of supplying the programming voltage thereto. The pad 22 is preferably placed internally on the circuit die on which the circuit 10 is formed so that a probe may be used to apply voltage to the pad 22 before the circuit die has been separated from other adjacent circuit dice on a semiconductor wafer.

Figure 2:
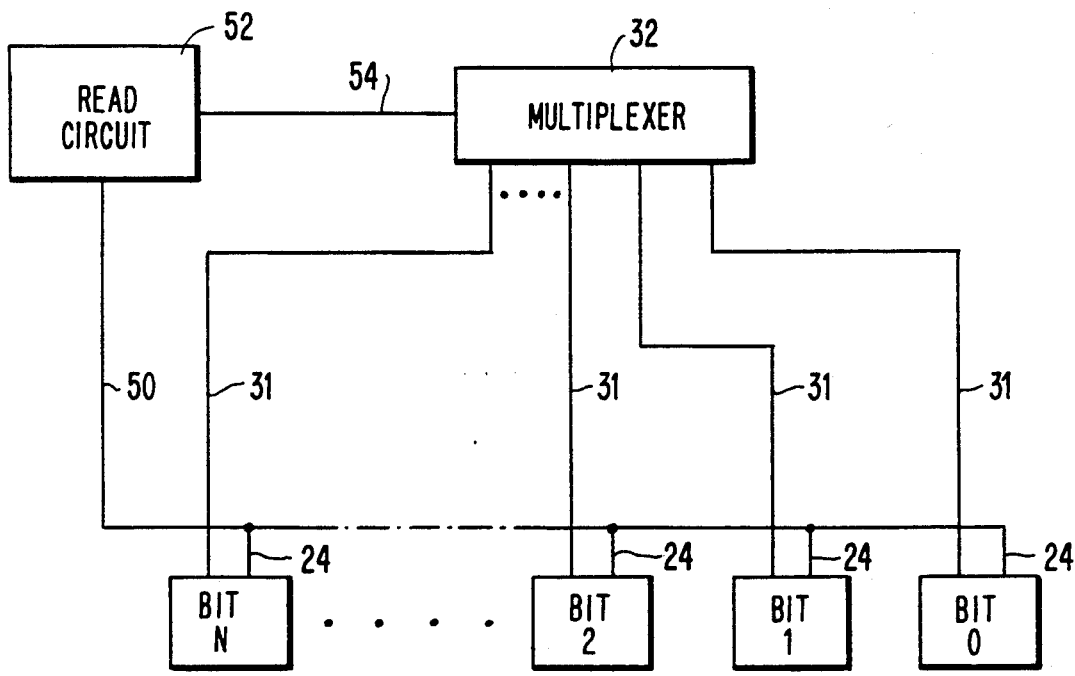

Once the capacitor 12 has been programmed, its state, i.e. open or shorted, can be sensed by applying a signal to the gate 14 and determining if there is continuity between the gate 14 and the source 16 or the drain 18. A sense line 24 is connected through a pass transistor 26 and a large value protection resistor 28 to the gate 14 for this purpose. A gate 30 of the pass transistor 26 is connected through a multiplexer output line 31 to a multiplexer 32 as illustrated in FIG. 2 which selectively enables the pass transistor 26 to apply a sense signal from read circuit 52 to the capacitor 12. The multiplexer 32 is discussed in greater detail with reference to FIG. 2.

In order to protect the read circuitry of the device which includes the pass transistor 26, a protection transistor 34 is connected at one side between pass transistor 26 and resistor 28 at a node A, and at a second side to ground. A gate 36 of the protection transistor 34 is connected to a protection transistor gate pad 38 for supplying an enabling voltage thereto. A pull down resistor 40 is connected between the gate pad 38 and ground. When the protection resistor 34 is enabled by application of a high signal to the gate pad 38, and a high voltage is applied to the programming voltage pad 22, the large value resistor 28 will insure that a relatively low voltage will be present at node A so that the pass transistor 26 and other related read circuitry will not be damaged.

An alternative method of programming the capacitor 12 is to place a high negative voltage on the programming voltage pad 22 and a positive voltage on the ground path 20. The substrate (not shown) on which the bit cell 10 would be formed would then be grounded. In this case, the drain of the protection transistor 34 acts as a diode that connects the protection resistor 28 to the substrate. The rest of the protection circuiting, i.e., the gate pad 38 and the pull down resistor 40, is not needed. The advantage of this programming method is that the same voltage difference between the gate 14 and the source 16 and drain 18 of the MOSFET or IGFET capacitor 12 is combined with a lower voltage over, and a lower current through, the protection resistor 28, which therefore allows this element to be made smaller. This also reduces the possibility that the gate connection to the MOSFET or IGFET capacitor 12 will be damaged during breakdown.

Turning now to FIG. 2, there is illustrated a circuit for reading values of a complete set of bit cells on a single circuit die. In particular, a plurality of bit cells labelled 0-N are illustrated which are configured in accordance with the circuit of FIG. 1. The sense lines 24 of each of the bit cells are connected to the sense bus 50 which is connected to a read circuit 52. The read circuit 52 is also connected via a line 54 to the multiplexer 32. It will be understood that the multiplexer output lines 31 and the sense bus 50 will be connected to the bit cells in any suitable manner, such as with external bond pads in the case where the read circuit 52 is external to the information circuit 10. In a more sophisticated implementation, the read circuit 52 can be incorporated onto the same circuit die on which the bit cells 10 are formed, and no external bond pads would be needed.

In operation, the read circuit 52 employs any suitable means to sense continuity or the lack thereof through the capacitor 12 of each of the bit cells O-N. The read circuit 52 sends control signals through the line 54 to the multiplexer to cause it to enable the pass transistor 26 in each of the bit cells sequentially. The read circuit 52 can incorporate any conventional memory means to record the binary value of each of the bit cells. From these values, the circuit die information can be derived.

Although the invention has been disclosed in terms of a preferred embodiment, it will be understood that numerous variations and modifications could be made thereto without departing from the true spirit and scope of the invention as set forth in the following claims.

What is claimed is:

1. A programmable circuit for encoding and storing information, comprising:
   (a) a plurality of single bit information storage and reading bit cells, each bit cell including
      (i) a field effect transistor having a gate, a source and a drain, the source and drain being connected in common to ground so as to constitute one plate of a capacitor structure of which said gate serves are the other plate thereof, there normally being an open circuit between said plates;
      (ii) means to selectively apply a high voltage to said gate so as to cause said capacitor structure to physically break down and form closed circuit between the plates thereof, whereby the capacitor structure acts as a single bit binary store representing a first binary value when there is an open circuit between said plates and representing a secondary binary value when there is a closed circuit between said plates; and
      (iii) a pass transistor for selectively connecting the gate of said bit cell to a sensing bus;
   (b) a read circuit connected to said sensing bus for sensing whether there is a closed or open circuit between the plates of the capacitor structure of a bit cell when the gate of such bit cell is connected to said sensing bus; and
   (c) multiplexer means for selectively enabling the pass transistors of successive bit cells to connect the gates thereof to said sensing bus, so that said read circuit successively senses whether there is a closed or an open circuit between the plates of the capacitor structures of the successive bit cells.

2. A circuit as claimed in claim 1, further comprising means for protecting said read circuit and the pass transistors of said bit cells from high voltage on the gates thereof, said protecting means comprising a resistor in each bit cell disposed between said gate and said pass transistor and means to connect the pass transistor side of such bit cell to ground when high voltage is applied to said gate.

3. An integrated circuit die which includes one or more circuits other than a programmable memory and further includes a programmable circuit for encoding and storing information relating to said die, said programmable circuit comprising:
  (a) a plurality of single bit information storage and reading bit cells, each bit cell including
    (i) a capacitor structure having a first plate and a second plate between which there is normally an open circuit, said capacitor structure being formed by a field effect transistor having a gate which constitutes said second plate and a source and drain which are connected together to ground and constitute said first plate; and
    (ii) means to selectively apply a high voltage to said second plate so as to cause said capacitor structure to physically break down and form a closed circuit between said first and second plates; and
  (b) means to sense whether there is an open or closed circuit between the plates of each of said bit cells, said means to sense comprising:
    (iii) a read circuit for sensing whether there is a closed or open circuit between the gate and the source or drain of each of said bit cells;
    (iv) a pass transistor in each bit cell which when enabled connects said read circuit to the gate of such bit cell; and
    (v) multiplexer means for successively enabling each of said pass transistors so that said read circuit is successively connected to the gates of the successive bit cells,
  whereby the capacitor structure of each bit cell acts as a single bit binary store which represents a first binary value when there is a closed circuit between the plates of such bit cell and which represents a second binary value when there is an open circuit between said plates.

4. The integrated circuit die of claim 3, further including means to protect said read circuit and the pass transistors of said bit cells from high voltage on the gates of said bit cells.

* * * * *